(12) United States Patent
Hijzen et al.

(10) Patent No.: US 6,498,071 B2
(45) Date of Patent: Dec. 24, 2002

(54) MANUFACTURE OF TRENCH-GATE SEMICONDUCTOR DEVICES

(75) Inventors: Erwin A. Hijzen, Breda (NL); Cornelis E. Timmering, Eindhoven (NL); John R. Cutter, Macclesfield (GB)

(73) Assignee: Koninklijke Phillips Electronics N.V., Eindhoven (NL)

( * ) Notice: Subject to any disclaimer, the term of this patent is extended or adjusted under 35 U.S.C. 154(b) by 18 days.

(21) Appl. No.: 09/725,410

(22) Filed: Nov. 29, 2000

(65) Prior Publication Data

US 2001/0009800 A1 Jul. 26, 2001

(30) Foreign Application Priority Data

Nov. 30, 1999 (GB) .............................. 9928285

(51) Int. Cl.[7] .............................................. H01L 21/76
(52) U.S. Cl. ...................... 438/425; 438/270; 438/272; 438/564
(58) Field of Search ................ 438/270, 268, 438/589, 596, 564, 271, 272, 425

(56) References Cited

U.S. PATENT DOCUMENTS

| | | | |
|---|---|---|---|
| 5,177,572 A | | 1/1993 | Murakami .................. 257/260 |
| 5,378,655 A | | 1/1995 | Hutchings et al. .......... 437/203 |
| 5,567,634 A | | 10/1996 | Hebert et al. ................ 437/41 |
| 5,747,831 A | * | 5/1998 | Loose et al. .................. 257/77 |
| 5,940,698 A | * | 8/1999 | Gardner et al. ............. 438/197 |
| 5,960,270 A | * | 9/1999 | Misra et al. ................. 438/197 |
| 6,034,894 A | * | 3/2000 | Maruyama et al. ..... 365/185.17 |
| 6,037,629 A | * | 3/2000 | Gardner et al. ............. 257/333 |
| 6,087,727 A | * | 7/2000 | Tsutsumi ..................... 257/754 |
| 6,124,608 A | * | 9/2000 | Liu et al. ..................... 257/315 |
| 6,251,730 B1 | * | 6/2001 | Luo ............................ 438/270 |

* cited by examiner

*Primary Examiner*—Matthew Smith
*Assistant Examiner*—Renzo N. Rocchegiani
(74) *Attorney, Agent, or Firm*—Steven P. Biren

(57) ABSTRACT

In the manufacture of a trench-gate semiconductor device, for example a MOSFET or an IGBT, a starting semiconductor body (10) has two top layers (13, 15) provided for forming the source and body regions. Gate material (11') is provided in a trench (20) with a trench etchant mask (51, FIG. 2) still present so that the gate material (11') forms a protruding step (30) from the adjacent surface (10a) of the semiconductor body, and a side wall spacer (32) is then formed in the step (30) to replace the mask (51). The source region (13) is formed self-aligned with the protruding trench-gate structure with a lateral extent determined by the spacer (32, FIG. 5), and the gate (11) is then provided with an insulating overlayer (18, FIG. 6). Forming the sidewall spacer (32) when the protruding trench-gate structure has a well-defined edge provided by the gate material (11') allows better definition of the source region (13) compared with a prior-art process in which the gate insulating overlayer is provided in the trench before causing the trench-gate structure to have the protruding step for the sidewall spacer.

8 Claims, 3 Drawing Sheets

MANUFACTURE OF TRENCH-GATE SEMICONDUCTOR DEVICES

BACKGROUND OF THE INVENTION

This invention relates to methods of manufacturing a trench-gate semiconductor device, for example an insulated-gate field-effect power transistor (commonly termed a "MOSFET") or an insulated-gate bipolar transistor (commonly termed an "IGBT"). The invention also relates to semiconductor devices manufactured by such a method.

Such trench-gate semiconductor devices are known having source and drain regions of a first conductivity type separated by a channel-accommodating body region of the opposite second conductivity type. An advantageous method of manufacture is disclosed in U.S. Pat. No. 5,378,655 (our reference PHB 33836), in which the formation of the source region is self-aligned with the trench (termed "groove") which comprises the gate. This self-alignment is achieved by the disclosed and taught method summarised as follows. A trench is etched through a window in a mask on a semiconductor body. After removing the mask, gate material is provided in the trench and then an upper portion of the gate material is oxidised to form a trench-gate structure which has an insulating cap on the gate. The insulating cap is then caused to form a step which protrudes from the adjacent semiconductor surface. A layer is then provided over the surface structure and then etched to leave a side wall spacer in the trench-gate step. The spacer is then used to define the source region which is thus formed to be self-aligned to the trench-gate structure.

The whole contents of U.S. Pat. No. 5,378,655 are hereby incorporated herein as reference material. By using such techniques as disclosed in U.S. Pat. No. 5,378,655, the number of photolithographic masking steps which require separate alignment can be reduced and compact cellular device structures can be formed.

Trench-gate semiconductor devices are also known in which the channel-accommodating body region is of the same, first conductivity type as the source and drain regions. In this case, the conductive channel is formed by charge-carrier accumulation by means of the trench-gate. Similar considerations arise with respect to the doping of the regions and the etching of the trench, as in the more usual device in which the channel-accommodating region is of the opposite, second conductivity type.

SUMMARY OF THE INVENTION

It is an aim of the present invention to modify the manufacture of trench-gate semiconductor devices so as to permit the use of a side wall spacer at the trench-gate structure for self-aligned formation of the source region while providing a simpler process with better definition of the source region.

According to the present invention there is provided a method of manufacture in which gate material is provided in a trench with a trench etchant mask still present so that the gate material forms a protruding step from the adjacent surface of the semiconductor body, a side wall spacer is formed in the step to replace the mask and the source region is formed with a lateral extent determined by the spacer, and then the gate is provided with an insulating overlayer.

The method as set out in claim 1 includes quite different steps (a) to (g) from the method steps of U.S. Pat. No. 5,378,655. In particular the side wall spacer is formed in the step in the trench gate structure at a stage before providing the gate with an insulating overlayer. The advantage is that the trench-gate structure at this early stage has a better defined edge provided by the gate material than the edge provided later by the oxidised gate insulating cap in the method of U.S. Pat. No. 5,378,655. As a result the lateral extent of the source region is better defined and so is the area over which the source electrode contacts the source region and the channel-accommodating body region.

Various preferred features in accordance with the invention are set out in claims 2 to 9. In one preferred feature formation of the side wall spacer may be achieved by removing the mask, then covering the protruding step of the gate material and the adjacent semiconductor body surface and then etching the covering material to leave the spacer. In another preferred feature, after formation of the source region, a dielectric cover may be provided beside the spacer to the top of the spacer, selective etching of the gate material leaves a gate top surface below the top of the spacer, the gate insulating overlayer is provided on the gate top surface and then the dielectric cover is removed. Alternatively, when the gate material is silicon, the insulating overlayer may be provided by oxidising an upper part of the gate material. In a preferred such oxidation method for forming the insulating overlayer, where the semiconductor body is monocrystalline silicon, the spacer is silicon dioxide and the gate material is doped polycrystalline silicon, different rates of oxidation produce thin and thick oxide layers respectively in the mono- and poly-crystalline silicon and the thin oxide layer is then removed to leave some of the thick oxide layer as the gate insulating overlayer. In another preferred feature three doped layers are initially provided in a starting semiconductor body with the source region and the channel-accommodating body region to be formed from the top two layers. After formation of the side wall spacer, the source region may be formed by etching through the top layer except where masked by the spacer and the layer underneath may be partly etched to provide a side surface of the body region also under the spacer.

BRIEF DESCRIPTION OF THE DRAWINGS

These and other features in accordance with the invention are illustrated in embodiments of the present invention, that are now to be described with reference to the accompanying diagrammatic drawings, in which.

Figure 1:
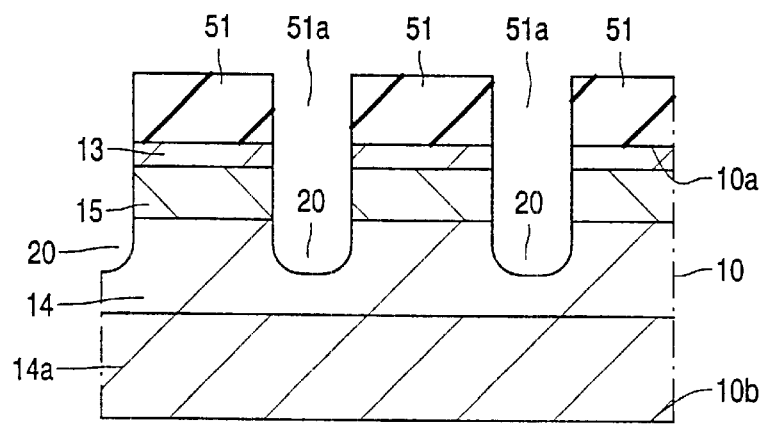
FIGS. 1 to 6 are a cross-sectional view of transistor cell areas of a semiconductor body at successive stages in the manufacture of a trench-gate semiconductor device by one example of a method in accordance with the present invention.

It should be noted that all the Figures are diagrammatic and not drawn to scale. Relative dimensions and proportions of parts of the drawings have been shown exaggerated or reduced in size, for the sake of clarity and convenience in the drawings. The same reference signs are generally used to refer to corresponding or similar features in different stages of manufacture and in modified and different embodiments.

DESCRIPTION OF THE PREFERRED EMBODIMENTS

Figure 6:
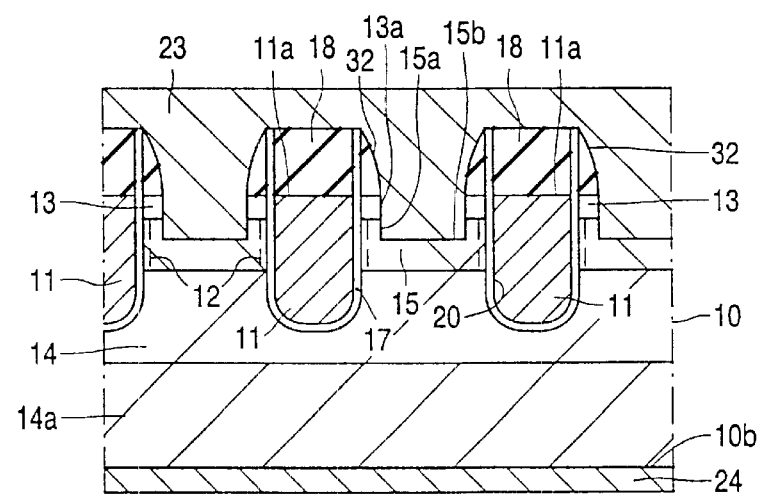

FIG. 6 illustrates an exemplary embodiment of a power semiconductor device having a trench-gate 11. In the transistor cell areas of this device, source and drain regions 13 and 14, respectively of a first conductivity type (n-type in this example) are separated by a channel-accommodating body region 15 of the opposite second conductivity type (i.e. p-type in this example). The gate 11 is present in a trench 20 which extends past the regions 13 and 15 into an underlying portion of the drain region 14. The application of a voltage signal to the gate 11 in the on-state of the device serves in known manner for inducing a conduction channel 12 in the region 15 and for controlling current flow in this conduction channel 12 between the source and drain regions 13 and 14.

The source region 13 is contacted by a source electrode 23 at the top of the device body. By way of example, FIG. 6 shows a vertical device structure in which the region 14 may be a drain-drift region formed by an epitaxial layer of high resistivity (low doping) on a substrate region 14a of high conductivity. This substrate region 14a may be of the same conductivity type (n-type in this example) as the region 14 to provide a vertical MOSFET, or it may be of opposite conductivity type (p-type in this example) to provide a vertical IGBT. The substrate region 14a is contacted at the bottom major surface 10b of the device body by an electrode 24, called the drain electrode in the case of a MOSFET and called the anode electrode in the case of an IGBT.

Figure 2:
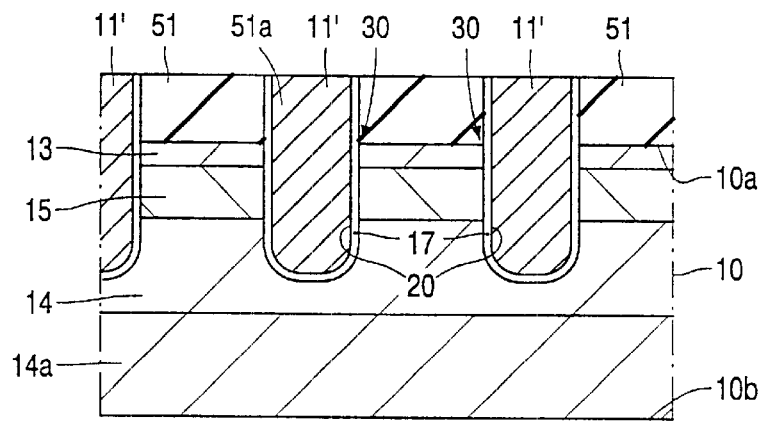
Figure 3:
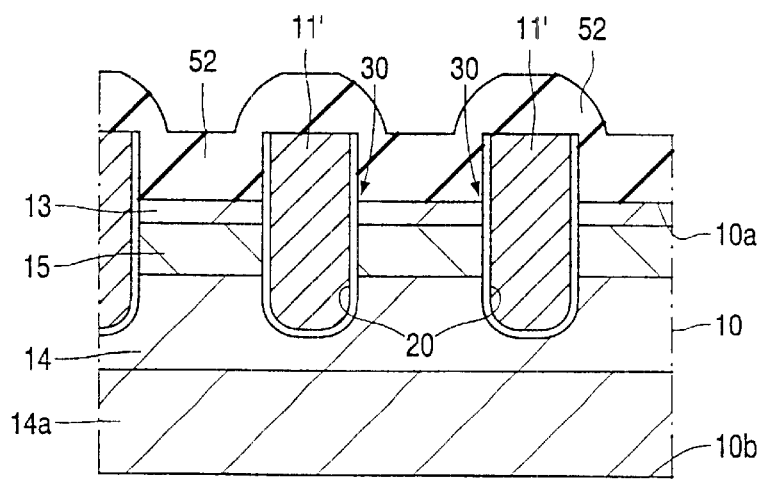
Figure 4:
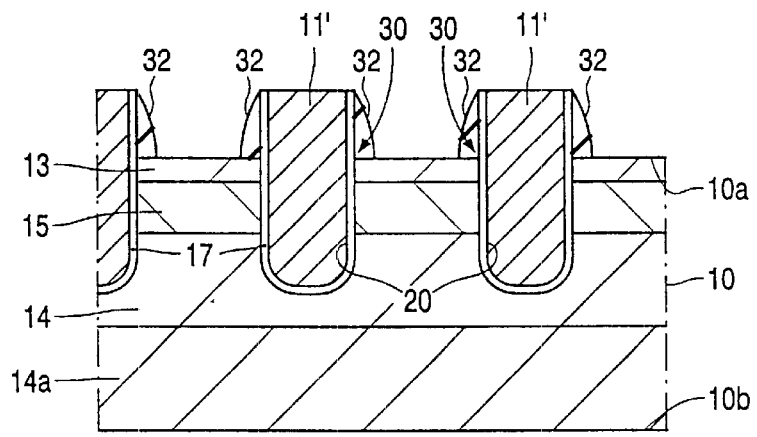
Figure 5:
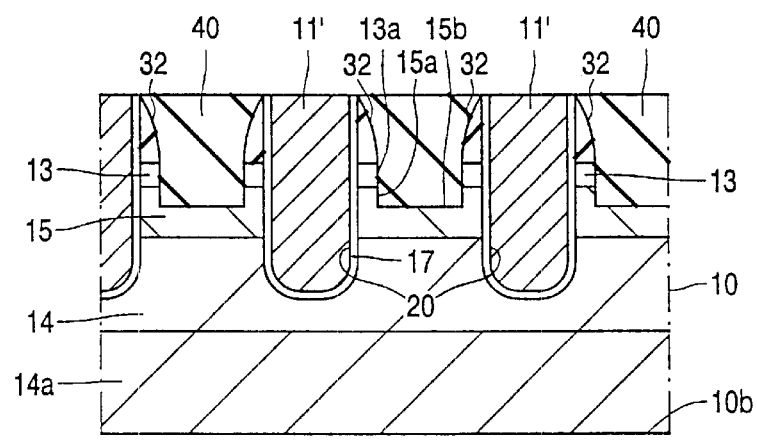

The device of FIG. 6 is manufactured by a method which, in overview of FIGS. 1 to 6, includes the steps of:

(a) forming at a surface 10a of a semiconductor body 10 (typically of monocrystalline silicon) a mask 51 having a window 51a at an area of the body 10; see FIG. 1;

(b) etching a trench 20 into the semiconductor body at the window 51a to extend past the body region 15 and into an underlying portion of the drain region 14, see FIG. 1;

(c) providing gate material 11' in the trench 20 and in the window 51a such that the gate material 11' forms a protruding step 30 from the adjacent surface of the semiconductor body 10 with the mask 51 still present, see FIG. 2;

(d) forming a side wall spacer 32 in the step 30 to replace the mask 51, see FIGS. 3 and 4;

(e) forming the source region 13 with a lateral extent from the trench 20 being determined by the spacer 32, see FIG. 5;

(f) providing the gate 11 with an insulating overlayer 18 after the source region 13 formation, see FIG. 6; and (g) providing a source electrode 23 to contact exposed surfaces 13a, 15a of the source region 13 and body region 15 and also to extend on the gate insulating overlayer 18, see FIG. 6.

In the embodiments illustrated in FIGS. 1 to 8 the sidewall spacer 32 is used to define the source region 13 which is thus formed to be self-aligned to the edge of the trench-gate structure provided by the gate material 11' at a stage before the gate insulating overlayer 18 is formed. This self-alignment permits a reproducible close spacing of the transistor cells, for example with a cell pitch of less than 2 $\mu$m, i.e. with a spacing of 2 $\mu$m (or less) between the centres of the neighbouring trenches 20.

No plan view of the cellular layout geometry is shown in the drawings, because the methods of FIGS. 1 to 8 may be used for quite different, known cell geometries. Thus, for example the cells may have a square geometry as illustrated in FIG. 14 of U.S. Pat. No. 5,378,655, or they may have a close-packed hexagonal geometry or an elongate stripe geometry. In each case, the trench 20 (with its gate 11) extends around the boundary of each cell. FIG. 6 shows only a few cells, but typically the device comprises many hundreds of these parallel cells between the electrodes 23 and 24. The active cellular area of the device may be bounded around the periphery of the body 10 by various known peripheral termination schemes (also not shown). Such schemes normally include the formation of a thick field-oxide layer at the peripheral area of the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells.

Successive stages in the fabrication of the transistor cells of FIG. 6 will now be described with reference to FIGS. 1 to 6.

Referring to FIG. 1, a semiconductor body 10 of monocrystalline silicon material is first provided having a substrate region 14a of high conductivity on which there is formed an epitaxial high resistivity (low-doped) n-type first layer 14 suitable for the drain drift region, an epitaxial p-type second layer 15 on top of the first layer suitable for the channel-accommodating body region, and an epitaxial high conductivity (high-doped) n-type third layer 13 on top of the second layer suitable for the source region. One or both of the layers 15 and 13 may alternatively be formed by introducing dopants into the layer 14, for example by implantation of suitable dopant ions followed by heating to diffuse the respective dopant to the desired depth for the layer 15 or 13.

As illustrated in FIG. 1, a thick oxide mask 51 is provided at the surface 10a of the semiconductor body 10. This mask 51 can be formed by depositing silicon dioxide material, and by subsequently opening windows 51a using known photolithographic and etching techniques. In this way, a well defined window-edge can be formed for the mask 51. The thickness of the oxide mask may be, for example, in the range of 0.2 $\mu$m to 0.5 $\mu$m. A silicon-etching treatment is then carried out in known manner, using the silicon dioxide mask 51 as an etchant mask, to etch the trench 20 into the silicon body 10 at the windows 51a. The resulting structure is illustrated in FIG. 1. The trench 20 extends through and past both the layer 13 for the source region and the layer 15 for the channel-accommodating body region, and extends into an underlying portion of the layer 14 for the drain region. The layout pattern of the trench 20 is an hexagonal grid when an hexagonal geometry device is being manufactured. The width of the etched trench 20 may be, for example, in the range of 0.5 $\mu$m to 1.0 $\mu$m.

As illustrated in FIG. 2, the silicon body 10 and the oxide mask 51 are now subjected to an oxidation treatment to grow a thin silicon dioxide layer on the exposed faces of the trench 20 which provides a gate insulating layer 17 in the trench 20. As illustrated in FIG. 2, polycrystalline silicon 11' may now be deposited in known manner in the windows 51a and on the oxide mask 51. This deposited polycrystalline silicon 11' is then etched back until the surface is planarised with the gate material 11' in the trench 20 where it is to form the gate 11 and also in the windows 51a such that the gate material 11' forms a protruding step 30 from the adjacent surface 10a of the semiconductor body 10 with the oxide mask 51 still present.

As illustrated in FIG. 3, the silicon dioxide mask 51 of FIG. 2 is removed entirely by etching, and then a new silicon dioxide layer 52 is deposited to cover the protruding steps 30 formed by the gate material 11' and the adjacent surface 10a of the semiconductor body 10, that is the upper surface of the layer 13. The thickness of the oxide layer may be, for example, in the range of 0.5 μm to 1.0 μm. The upper surface of the layer 52 has a contour determined by the protruding steps of the gate material 11'.

As illustrated in FIG. 4, the oxide layer 52 is now etched anisotropically, that is uniformly etched back in a downward direction, to leave sidewall spacers 32 in the steps 30 which replace the mask 51 shown in FIGS. 1 and 2. The n-type layer 13 is left exposed adjacent the sidewall spacers 32

FIG. 5 illustrates two further stages in the fabrication of the transistor cells. In the first stage, the monocrystalline silicon is etched through the exposed n-type layer 13 and partly through the p-type layer 15 where it underlies the exposed layer 13. This etching forms, for each transistor cell, the source region 13 with a lateral extent from the trench 20 being determined by the spacer 32. This etching also provides an exposed side surface 13a of the source region 13 under the spacer 32 and an exposed side surface 15a of the body region 15 also under the spacer 32. Also, an upper surface 15b of the body region 15 is exposed within each transistor cell.

For each transistor cell, each two adjacent trench 20 sections as shown in FIGS. 1 to 6 are sections through an annular trench 20 which extends around the boundary of the cell. The upper surface 15b of the body region 15 is at a central region of the cell. Two sidewall spacer sections 32, as shown in FIGS. 4 to 6, one each at the edge of one of two adjacent trench sections 20 are sections through an annual spacer 32 which extends around the cell within the annular trench 20. Two source region sections 13, as shown in FIGS. 5 and 6, one each at the edge of one of two adjacent trench sections 20 are sections through an annular source region 13 under the annular spacer 32 with an annular exposed side surface 13a. The exposed side surface 15b of the body region 15 is similarly annular. The lateral extent of the source region 13 is determined and well defined by the spacer 32 due to the spacer 32 being formed against a trench-gate structure which has a well defined edge, as shown in FIG. 2, provided by the gate material 11'.

In the second stage illustrated in FIG. 5, the exposed top surface of the gate material 11', the sidewall spacers 32, the exposed side surface 13a of the source region 13 and the exposed surfaces 15a and 15b of the body region 15 are covered with dielectric material 40 which may be, for example silicon nitride material or a phospho-silicate glass material. This dielectric material 40 is then etched back down to the top surface of the gate material 11'. Thus, as shown in FIG. 5, a dielectric cover 40 is provided over the body region 15, the source region 13 and the sidewall spacer 32 to the top of the spacer 32, but not over the gate material 11'. The resulting structure is illustrated in FIG. 5.

FIG. 6 illustrates three further stages in the formation of the transistor cells which precede provision of a source electrode. In the first stage, selective etching is performed to remove some of the gate material 11' and leave a gate 11 with a top surface 11a below the top of the spacer 32 while leaving the dielectric cover 40. In the next stage a thick layer of silicon dioxide is deposited on the top surface, that is to cover the top surface 11a of the gate 11 and the top surface of the dielectric cover 40, and then this thick silicon dioxide layer is etched back down to the top of the spacers 32. Thus the removed gate material 11 is replaced by an insulating overlayer 18 of silicon dioxide material on the gate top surface 11a. It is particularly noted that in the fabrication method as described and as illustrated in FIGS. 1 to 6, the gate 11 is provided with the insulating overlayer 18 after formation of the source region 13. In the next stage the dielectric cover 40 is removed. This removal may be by a wet etch in which the etch rate of the dielectric cover 40 is much faster than that of the silicon dioxide gate insulating overlayer 18 so as to leave the insulating layer 18 substantially unaltered. Known etchants may be used for this stage, for example BOE 7:1 (that is Buffered Oxide Etchant, a mixture of HF and $NH_4F$) in the case of the dielectric 40 being phospho-silicate glass and nitride etch in the case of the dielectric 40 being silicon nitride. Removal of the dielectric cover 40 exposes again the surface 13a of the source region 13, the surfaces 15a and 15b of the channel-accommodating body region 15 and also the top surface of the gate insulating overlayer 18.

Also as illustrated in FIG. 6, electrode material (for example aluminium) is now deposited to provide the source electrode 23 to contact the exposed surface 13a of the source region 13 and the exposed surfaces 15a and 15b of the channel-accommodating body region 15 and also to extend on the gate insulating overlayer 18.

It will be evident that many variations and modifications are possible within the scope of the present invention. Before describing the modified fabrication stages illustrated in FIGS. 7 and 8, some possible variations and modifications which are not illustrated are mentioned as follows. The portion of the body region 15 in the central region of at least one of the transistor cell areas below the surface 15b can be made more highly doped than the portion of the body region 15 below the spacer 32 that accommodates the channel region 12 (shown in FIG. 6). This higher doped region may be provided by introducing dopant of the second conductivity type (acceptor dopant in this example) by, for example, ion implantation at a suitable stage after providing the spacers 32 and before providing the source electrode 23. This higher doped region will form an improved contact region for the source electrode. The source region 13 as shown in FIGS. 5 and 6 need not be formed from an initially provided epitaxial layer 13 as shown in FIG. 1. This initial layer 13 may be absent and instead the spacers 32 may be fabricated from a doped (donor doped in this example) material, for example doped silicon dioxide, on the layer 15. At a suitable stage, for example after partly etching through the layer 15 and before providing the dielectric material 40, that is between the first and second stages described above in relation to FIG. 5, such doped spacers 32 may be heated to cause n-type dopant to diffuse out of the doped spacers 32 into the underlying portion of the layer 15 to define the source regions 13. The sidewall spacers 32 may be formed from material other than silicon dioxide by the same fabrication steps as illustrated in FIGS. 1 to 4, for example the mask 51 and the replacement layer 52 shown in FIGS. 1 to 3 may be silicon nitride material or a phospho-silicate glass material. In this case the dielectric cover material 40 could be silicon dioxide material. Further in this case, the first two stages described above in relation to FIG. 6 could be performed by again removing some of the gate material 11' (for example with a plasma etch) and then providing the insulating overlayer 18 of a dielectric which is deposited and then planarised (for example with chemical and mechanical polishing) to the top of the spacers 32.

Figure 7:
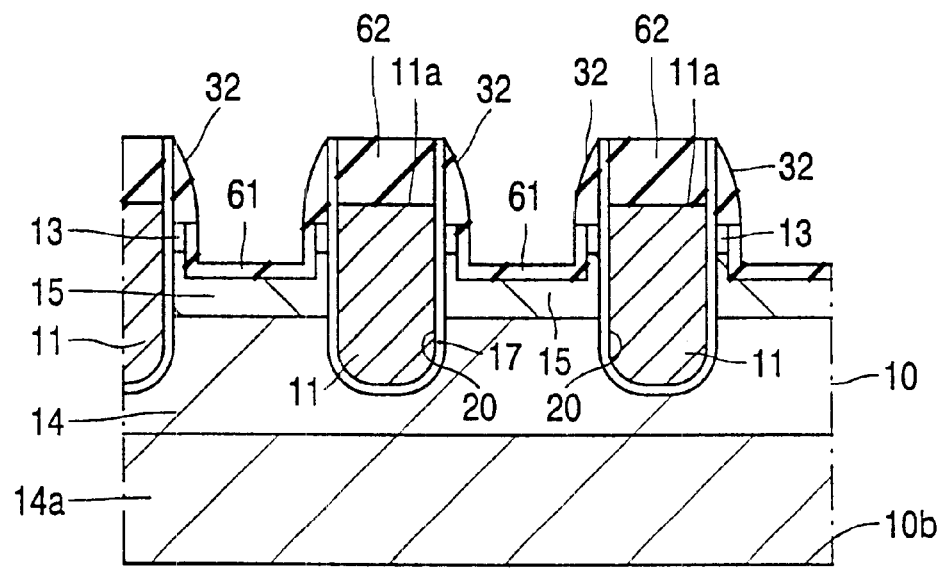
FIGS. 7 and 8 are a cross-sectional view of the transistor cell areas of FIG. 4 at subsequent successive stages different to the stages shown in FIGS. 5 and 6 in a modified manufacturing method which is also in accordance with the invention.
Figure 8:
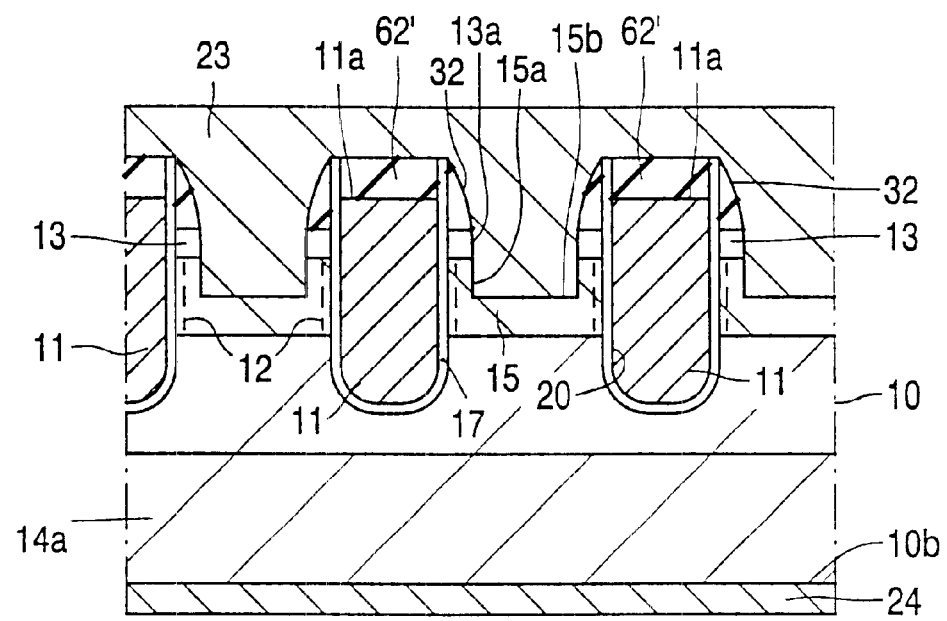

Referring now to FIGS. 7 and 8, a particular modification of the method of FIGS. 1 to 6 is illustrated. In this modified method, the fabrication stages are the same as those described in relation to FIGS. 1 to 5, up to and including the first fabrication stage described in relation to FIG. 5. That is, as shown in FIG. 5, for each transistor cell, there is a monocrystalline silicon source region 13 with an exposed side surface 13a under the silicon dioxide spacer 32, and a monocrystalline silicon body region 15 with an exposed side surface 15a under the spacer 32 and an exposed upper surface 15b. The important exception is that after deposition of the polycrystalline silicon 11', this material is heavily doped, for example by POCL$_3$ doping. Further, instead of providing the dielectric cover 40 according to the second stage illustrated in FIG. 5, a low temperature oxidation is performed, for example at 700° C. Due to its much higher doping concentration the doped polycrystalline silicon gate material 11' oxidises much faster (in the order of ten times) than the monocrystalline silicon. Therefore a thin oxide layer 61 is formed in the monocrystalline silicon covering the source region 13 and body region 15, and a thick oxide layer 62 is formed in the doped polycrystalline silicon as an insulating layer covering a top surface 11a of a gate 11. This structure is illustrated in FIG. 7.

Referring now to FIG. 8, the structure of FIG. 7 is dipped in an etchant to remove the thin oxide layer 61, some of the sidewall spacer 32 and some of the thick oxide layer 62. There is again provided an exposed surface 13a of the source region 13, exposed surfaces 15a and 15b of the channel-accommodating body region 15 and an exposed top surface of a gate insulating overlayer 62'.

An advantage of the modification described with reference to FIGS. 7 and 8 compared with the method of FIGS. 5 and 6 is that one less planarisation step is required, but a possible relative disadvantage may be that the oxidation step is accompanied by some diffusion of dopant. Although the oxidation step narrows the source region, the definition of it will still be good since the process is still fully self-aligned.

As illustrated in FIG. 8, electrode material (for example aluminium) is now deposited, in the same manner as previously described in relation to FIG. 6, to provide the source electrode 23 to contact the exposed surface 13a of the source region 13 and the exposed surfaces 15a and 15b of the channel-accommodating body region 15 and also to extend on the gate insulating overlayer 62'.

Usually the conductive gate 11 is formed of doped polycrystalline silicon as described above. However, other known gate technologies may be used in particular devices. Thus, for example, additional materials may be used for the gate, such as a thin metal layer that forms a silicide with the polycrystalline silicon material. Alternatively, the whole gate 11 may be of a metal instead of polycrystalline silicon. FIGS. 2 to 8 illustrate the preferred situation of an insulated gate structure, in which the conductive gate 11 is capacitively coupled to the channel-accommodating body region 15 by an insulating dielectric layer 17. However, so-called Schottky gate technologies may alternatively be used. In this case, a gate insulating dielectric layer 17 is absent and the conductive gate 11 is of a metal that forms a Schottky barrier with the low-doped channel-accommodating body region 15. The Schottky gate 11 is capacitively coupled to the channel-accommodating region 15 by the depletion layer present at the Schottky barrier.

FIGS. 6 and 8 illustrate a device having a p-type body region 15 of a uniform depth in the central region of each cell, without any deeper, more highly doped (p+) region such as is often used to improve device ruggedness. Some of the cells (not shown) of the device of FIGS. 6 and 8 may comprise a deeper, more highly doped (p+) region instead of the channel-accommodating region 15. These deeper, more highly doped (p+) regions may be implanted through windows of an appropriate mask, for example before the FIG. 1 stage. It is also possible to implant a deeper, more highly doped (p+) localised region within an active cell having a channel-accommodating region 15, but the cell geometry is less compact in this case.

The particular examples described above are n-channel devices, in which the regions 13 and 14 are of n-type conductivity, the region 15 is of p-type, and an electron inversion channel 12 is induced in the region 15 by the gate 11. By using opposite conductivity type dopants, a p-channel device can be manufactured by a method in accordance with the invention. In this case, the regions 13 and 14 are of p-type conductivity, the region 15 is of n-type conductivity, and a hole inversion channel 12 is induced in the region 15 by the gate 11.

Similar processing steps may even be used to manufacture an accumulation-mode device in accordance with the invention. Such a device of the p-channel type has a p-type source and drain regions 13 and 14a, and a p-type channel-accommodating region 15. It may also have an n-type deep localised region within each cell. N-type polycrystalline silicon may be used for the gate 11. In operation, a hole accumulation channel 12 is induced in the region 15 by the gate 11 in the on-state. The low-doped p-type region 15 may be wholly depleted in the off-state, by depletion layers from the insulated gate 11 and from the deep n-type region.

A vertical discrete device has been illustrated with reference to FIGS. 1 to 8, having its second main electrode 24 contacting the region 14a at the back surface 10b of the body 10. However, an integrated device is also possible in accordance with the invention. In this case, the region 14a may be a doped buried layer between a device substrate and the expitaxial low-doped drain region 14. This buried layer region 14a may be contacted by an electrode 24 at the front major surface 10a, via a doped peripheral contact region which extends from the surface 10a to the depth of the buried layer.

From reading the present disclosure, other variations and modifications will be apparent to persons skilled in the art. Such variations and modifications may involve equivalent and other features which are already known in the design, manufacture and use of semiconductor devices and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

What is claimed is:

1. A method of manufacturing a trench-gate semiconductor device having source and drain regions which are separated channel-accommodating body region adjacent to the trench-gate, including the steps of:
    (a) forming at a surface of a semiconductor body a mask having a window at an area of the body,
    (b) etching a trench into the semiconductor body at the window to extend through the body region and into an underlying portion of the drain region,
    (c) providing gate material in the trench and in the window such that the gate material forms a protruding step from the adjacent surface of the semiconductor body with the mask still present, (d) removing the mask from the protruding step and thereafter forming a side wall spacer in the step to replace the mask, (e) forming the source region with a lateral extent from the trench being determined by the spacer, (f) providing an insulating overlayer over the gate after using the sidewall spacer for the source region formation, and (g) providing a source electrode to contact exposed surfaces of the source region and body region and also to extend on the gate insulating overlayer.

2. A method as claimed in claim 1, wherein in step (d) the mask is removed, then the protruding step of the gate material and the adjacent surface of the semiconductor body are covered with material for the side wall spacer, and then this material is etched to leave the side wall spacer.

3. A method as claimed in claim 1, wherein in step (f) a dielectric cover is provided over the body region, the source region and the side wall spacer to the top of the spacer, but not over the gate material, then selective etching is performed to remove some of the gate material and leave a gate top surface below the top of the spacer while leaving the dielectric cover, and then the removed gate material is replaced by the insulating overlayer on the gate top surface, and wherein in step (g) the dielectric cover is removed to provide the exposed surfaces of the source region and body region.

4. A method as claimed in claim 1, wherein in step (c) the gate material is silicon material and is provided on an insulating layer in the trench, and wherein in step (f) an upper part of the silicon gate material is oxidised to provide the gate with the insulating overlayer.

5. A method as claimed in claim 4, wherein the semiconductor body is monocrystalline silicon material, the side wall spacer is silicon dioxide material and the gate material is doped polycrystalline silicon, wherein in step (f) the monocrystalline and polycrystalline silicon are oxidised to form a thin oxide layer in the monocrystalline silicon and a thick oxide layer in the doped polycrystalline silicon, and wherein etching is then performed to remove the thin oxide layer and some of the side wall spacer to provide exposed source and body regions as required in step (g) while leaving some of the thick oxide layer to provide the gate insulating overlayer.

6. A method as claimed in claim 1, wherein the semiconductor body provided for step (a) has a first layer of conductivity type suitable for the drain region, a second layer on top of the first layer, the second layer being of a conductivity type suitable for the channel-accommodating body region, and a third layer on top of the second layer, the third layer being of a conductivity type suitable for the source region.

7. A method as claimed in claim 6, wherein step (d) leaves the third layer exposed adjacent the side wall spacer, and wherein step (e) is performed by etching through the exposed third layer and partly through the second layer where it underlies the exposed third layer to provide a side surface of the source region under the spacer and a side surface of the channel-accommodating body region also under the spacer.

8. A method as claimed in claim 1, wherein the source and drain regions are of a first conductivity type, and wherein the channel-accommodating body region is of an opposite, second conductivity type.

* * * * *

UNITED STATES PATENT AND TRADEMARK OFFICE
CERTIFICATE OF CORRECTION

PATENT NO. : 6,498,071 B2
DATED : December 24, 2002
INVENTOR(S) : Erwin A. Hijzen, Cornelis E. Timmering and John R. Cutter It is certified that error appears in the above-identified patent and that said Letters Patent is hereby corrected as shown below:

<u>Title page,</u>
Item [73], Assignee, change "Phillips" to -- Philips --.

Signed and Sealed this

Twenty-fifth Day of March, 2003

JAMES E. ROGAN
*Director of the United States Patent and Trademark Office*